United States Patent
Gruning et al.

(10) Patent No.: US 6,441,407 B1
(45) Date of Patent: Aug. 27, 2002

(54) GATE CONTROLLED THYRISTOR DRIVEN WITH LOW-INDUCTANCE

(75) Inventors: Horst Gruning, Wettingen; Thomas Keller, Gipf-Oberfrick; Sven Klaka, Nussbaumen, all of (CH); Alexander Klett, Waldshut-Tiengen (DE); Philippe Maibach, Brugg; Bjorn Odegard, Turgi, both of (CH); Jochen Rees, Waldshut-Tiengen (DE)

(73) Assignee: Asea Brown Boveri AG, Baden (CH)

(*) Notice: Subject to any disclaimer, the term of this patent is extended or adjusted under 35 U.S.C. 154(b) by 0 days.

(21) Appl. No.: 09/582,944
(22) PCT Filed: Jan. 8, 1999
(86) PCT No.: PCT/CH99/00008
§ 371 (c)(1),
(2), (4) Date: Dec. 19, 2000
(87) PCT Pub. No.: WO99/35687
PCT Pub. Date: Jul. 15, 1999

(30) Foreign Application Priority Data

Jan. 9, 1998 (DE) .......................................... 198 00 469

(51) Int. Cl.$^7$ ............................................... H02L 23/02
(52) U.S. Cl. ..................... 257/132; 257/133; 257/137; 257/138
(58) Field of Search ................................. 257/138, 137, 257/133, 132, 150–153, 177, 180–182, 688–693, 732

(56) References Cited

U.S. PATENT DOCUMENTS 5,198,882 A * 3/1993 Matsuda et al. ............ 257/156
5,360,985 A * 11/1994 Hiyoshi et al. ............. 257/181

FOREIGN PATENT DOCUMENTS

| EP | 785627 A2 | * 7/1997 |
| WO | WO97/21248 | 6/1997 |
| WO | WO-9721248 A | * 6/1997 |

OTHER PUBLICATIONS

Serienschaltung von GTO–Thyristoren fur Frequenzumrichter hoher Leistung, Dr Peter Steimer et al., ABB Technik May 1996, pp 14–20.

* cited by examiner

Primary Examiner—Nathan J. Flynn
Assistant Examiner—Thomas L. Dickey
(74) Attorney, Agent, or Firm—Burns, Doane, Swecker & Mathis, L.L.P.

(57) ABSTRACT

A semiconductor component including a housing for a semiconductor substrate, an anode, a cathode, an annular gate electrode flange, which laterally protrudes from the housing and concentrically surrounds the housing, and an annular auxiliary cathode flange, which protrudes from the housing and makes contact with the cathode.

14 Claims, 9 Drawing Sheets

GATE CONTROLLED THYRISTOR DRIVEN WITH LOW-INDUCTANCE

BACKGROUND OF THE INVENTION

The present invention is concerned with the field of power semiconductor technology. It relates to a semiconductor component, in particular a thyristor, and to a semiconductor device.

Gate Controlled Thyristors or GCTs such as GTOs are driven with particularly low inductance in many demanding applications (in this respect, see, for example, an article by P. Steiner, H. Grüning et al., "Serienschaltung von GTO-Thyristoren für Frequenzumrichter hoher Leistung" [Series connection of GTO thyristors for high-power frequency converters], ABB Technik 5/1996, pp. 14–20, in particular FIG. 5). For the low-inductance connection between the component and the drive circuit situated on a connection board, a housing with a coaxial gate connection was proposed in an earlier patent application (not a prior publication), said housing enabling a contact inductance of <1 nH between the GCT and the connection board. In the proposal, contact is made with the cathode of the GCT via a plate which is separate from the GCT, said plate taking the form e.g. of a continuous baseplate of the gate unit. The mounting of the GCT becomes simple as a result:

- the connection board of the gate unit is placed onto the baseplate with ring;
- on top of this comes the gate connection of the GCT, the GCT being placed by its housing into the resulting well;
- the multilayer arrangement comprising baseplate/ring, connection board and GCT gate connection is screwed together at various points using screws. The connections from board to gate and cathode of the GCT are thus produced.

Another, improved embodiment avoids the costly arrangement of large-area, close-tolerance and nickel-plated baseplate and ring by replacing both of them by a deep-drawn well. Production can be significantly simplified as a result.

However, both variants are affected by a thermal disadvantage: the plate of the cathode well lies between the cathode flange and the heat sink and thus forms a second, further junction for the heat which emanates from the GTC and must be dissipated. That leads to a significant (>5%) reduction in the overall system performance, particularly in systems in which efficient cooling is a matter of importance.

SUMMARY OF THE INVENTION

The object of the invention, therefore, is to provide a semiconductor component and a semiconductor device of the type mentioned at the beginning which do not have the disadvantages described and are distinguished by greatly improved heat transfer in particular together with a simple structure and easy mounting on the cathode side.

The object is achieved by means of a semiconductor component, in particular a thyristor, and by means of a semiconductor device.

The invention's semiconductor element and the semiconductor device, comprising gate unit and semiconductor component, enable a low-inductance connection between gate unit and insulating housing of the semiconductor component. A well for making contact with the cathode is no longer necessary since an auxiliary cathode is arranged directly on the housing. This is achieved by virtue of the fact that, in the semiconductor component, both gate connection and an auxiliary cathode connection comprise a respective flange protruding from the insulation housing, which enclose a printed circuit board or connection board of the gate unit when the semiconductor component is mounted. The gate connection and the auxiliary cathode connection thus form a pair of rings which preferably lie parallel one above the other and between which the connection board reaches the housing of the thyristor when the thyristor is mounted. This makes it possible to realize low-inductance, annular connections in the form of protruding flanges between gate and/or cathode and the connection board. The cathode itself remains uninfluenced thereby and can be brought into direct contact with the heat sink without any thermal impairment.

The mounting can be simplified by special shaping of the printed circuit and/or semiconductor component. In a first embodiment, the printed circuit board is provided with a concave incision which can be pushed into the gap formed by the two flanges. In further embodiments, in order that the thyristor can receive the connection board between auxiliary cathode connection and gate connection in the course of mounting without any difficulty and without any intervention in the connection configuration, specific mounting means are provided on a mounting opening in the printed circuit board and on the connections of the thyristor.

A first preferred embodiment of the invention is distinguished by the fact that the means are designed in such a way that the thyristor can be inserted into the mounting opening with the housing axis oriented perpendicular to the connection board and can be brought into the connection position by rotation about the housing axis. In this embodiment, the mounting operation is particularly simple while the mounting means have to be configured in a comparatively complicated manner. Preferably, the auxiliary cathode connection and/or the gate connection are/is subdivided into a plurality of segments, which are arranged such that they are distributed over the circumference and are separated from one another by first cutouts, and the mounting opening comprises second cutouts in segment form, which are arranged such that they are distributed over the inner circumference and their number and dimensions correspond to those of the segments. In the course of mounting, the segments of the thyristor are inserted through the second cutouts, until the connection board lies between the connections, and the thyristor is then rotated until the segments are located above and/or below the regions between the second cutouts and can be connected there to the connection board.

A second preferred embodiment of the invention is characterized by the fact that the means are designed in such a way that the thyristor can be screwed into the mounting opening with the housing axis oriented in an inclined manner with respect to the connection board. In this embodiment, the mounting means are designed in a particularly simple manner while the mounting operation itself requires somewhat greater adroitness. Preferably, the auxiliary cathode connection and/or the gate connection have/has at least one first cutout in segment or slot form on its circumference, and the mounting opening has at least one second cutout in segment or slot form on its inner circumference.

When a cutout in segment or slot form is used, it is advantageous that the connection board has merely a small interruption. This optimizes the gate current gradient.

The mounting means (segments and cutouts) may be present on the auxiliary cathode connection alone, on the gate connection alone, or on both connections. In the first case, the thyristor must be inserted (from above) with the cathode side first into the mounting opening. In the second case, the thyristor must be inserted (from below) with the anode side first into the mounting opening. In the third and last case, the insertion can be effected optionally from either of the two sides.

In general, such semiconductor devices comprising a respective gate unit with a semiconductor component arranged therein are inserted in a manner stacked one above the other. In the case of the semiconductor device according to the invention, it is advantageous that if a semiconductor component exhibits a defect, the entire stack does not have to be taken apart in order to exchange the defective element.

BRIEF DESCRIPTION OF THE DRAWINGS

The invention will be explained in greater detail below with reference to exemplary embodiments in conjunction with the drawing, in which.

DETAILED DESCRIPTION OF THE PREFERRED EMBODIMENTS

Figure 1:
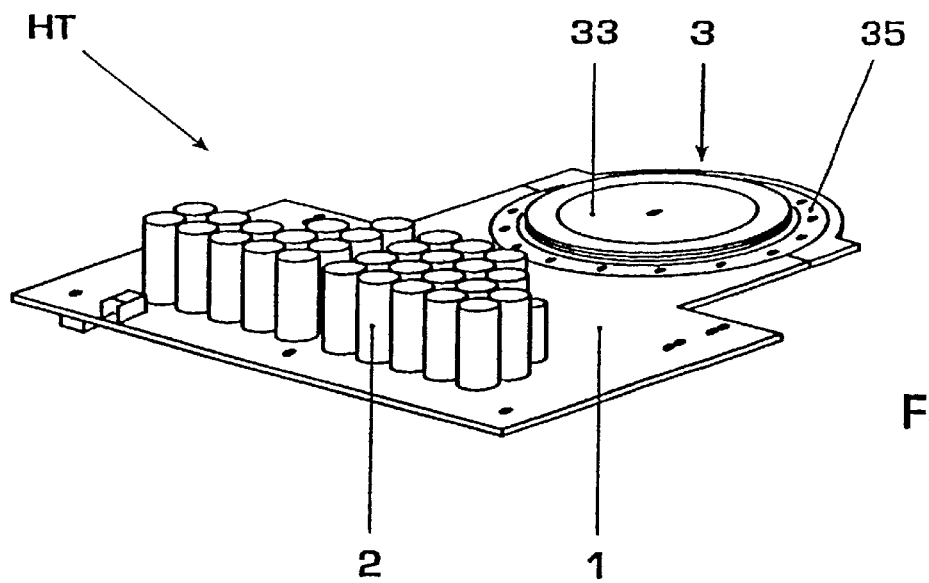
FIG. 1 shows a perspective illustration of a semiconductor device according to an exemplary embodiment of the invention with a built-in semiconductor component.

FIG. 1 illustrates a semiconductor device HT according to the invention. The semiconductor device HT comprises a gate unit GE, with a printed circuit board, also called connection board 1, and electrical devices 2 arranged thereon, and also a high-power semiconductor component 3 held in the connection board 1.

The connection board 1 is generally of multilayer construction. At least a portion of the electrical devices 2 serves for controlling the gate and comprises capacitors, for example.

Figure 2C:
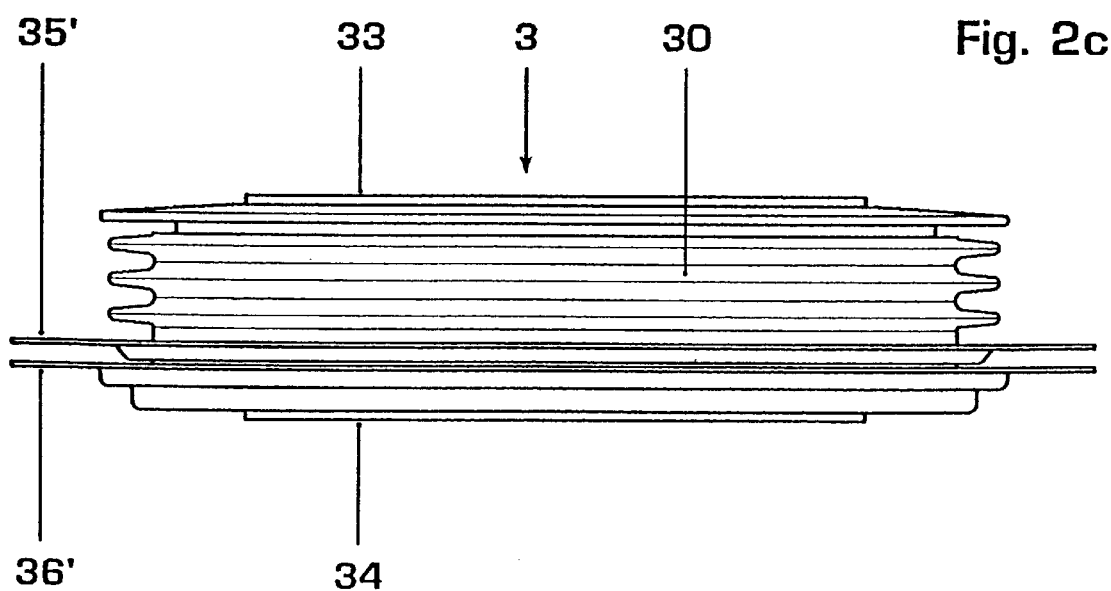
FIG. 2c shows a side view of a second embodiment of the semiconductor component according to the invention.
Figure 2A:
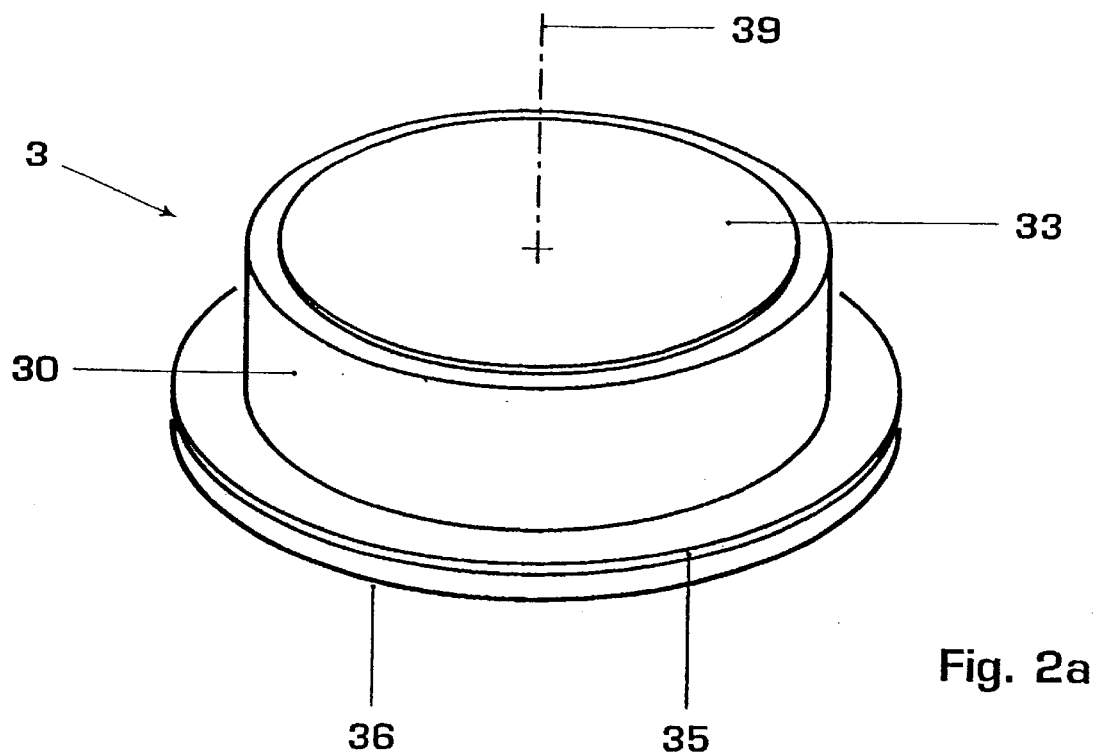
FIG. 2a shows a semiconductor component in perspective view in accordance with one exemplary embodiment of the invention (the mounting means not being illustrated)
Figure 3A:
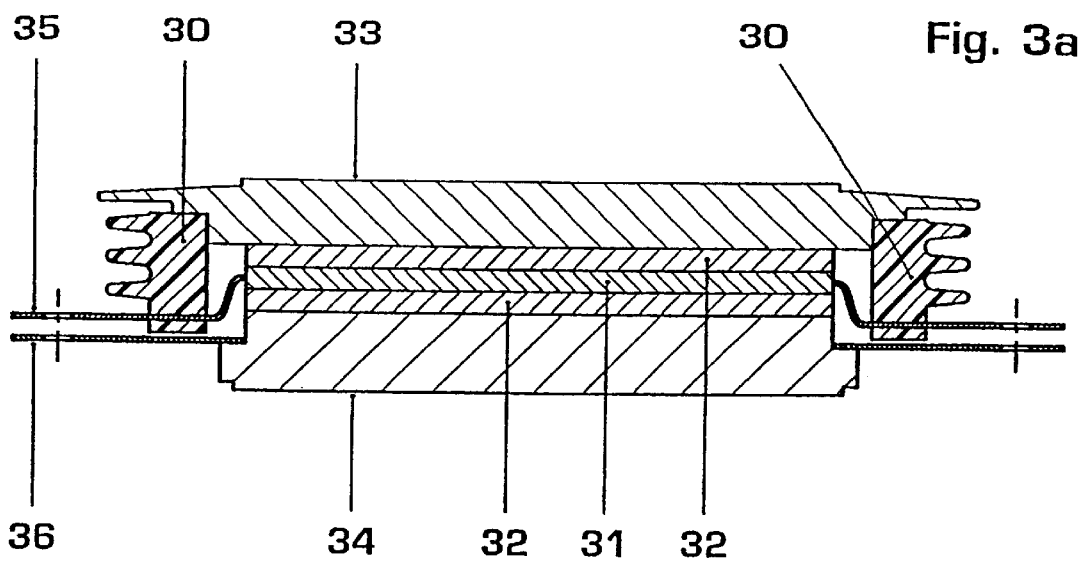
FIG. 3a shows a cross section through the semiconductor component according to FIG. 2c.

FIG. 2a represents a perspective view of a semiconductor component in the form of a thyristor in accordance with one exemplary embodiment of the invention. The gate controlled thyristor 33 comprises an Si-based semiconductor substrate 31 (visible in FIG. 3a) in which a multiplicity of individual elements are arranged next to one another in a known manner.

The semiconductor substrate 31 is preferably embedded between two molybdenum disks 32. The semiconductor substrate 31 is accommodated in a hermetically sealed insulating housing 30. In the example, the housing 30 is rotationally symmetrical about a housing axis 39. It comprises a cylindrical side part which is usually produced from a ceramic and has an undulating profile (shown in FIG. 2c) in order to lengthen the creepage path. Arranged on the ends of the housing 30 are—as can also be discerned from the side view in FIG. 2b—a circular, large-area anode 33 (upper end) and a corresponding cathode 34 (lower end) via which the thyristor 33 is electrically and thermally coupled to adjacent cooling boxes in an installation stack which is subject to axial pressure.

In a plane between the anode 33 and the cathode 34, an annular gate connection 35 concentrically surrounding the housing 30 projects laterally from the housing 30, which gate connection forms a gate electrode flange protruding radially from the housing 30. Preferably, the gate electrode flange at least approximately forms a solid circle, in which case it has first screw holes 35' distributed over its circumference.

An auxiliary cathode connection 36, which is designed as a concentric annulus which projects laterally and beyond the housing 30 and surrounds the cathode 34, lies parallel to the gate connection 35 in a plane below the gate connection 35, which auxiliary cathode connection forms an auxiliary cathode flange. The auxiliary cathode flange has a plurality of second screw holes 36' aligned with the first screw holes 35' of the gate electrode flange.

The gate connection 35 and auxiliary cathode connection 36 each comprise a metal ring, which are preferably hard-soldered. Outside the housing 30, the connections run at least approximately parallel to one another, at least that part of one and/or the other connection 35, 36 which projects beyond the housing 30 being constructed in a planar manner. The two connections 35, 36 preferably have the same external radius.

Figure 3B:
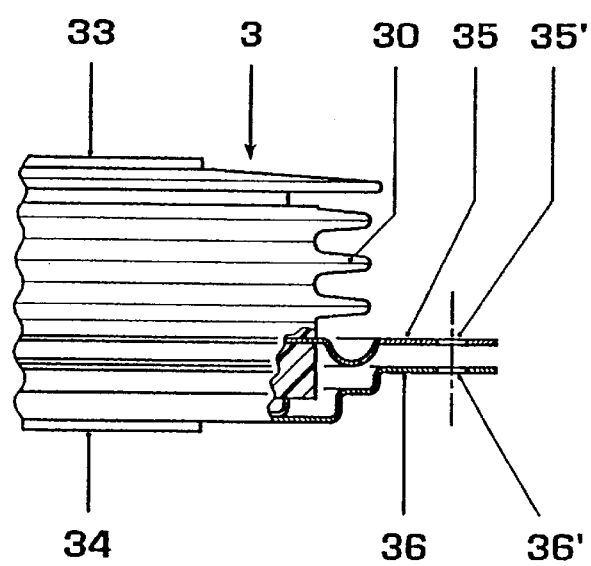
FIG. 3b shows a partial section through an exemplary third embodiment.

FIG. 3b illustrates a third embodiment. In this case, the connections running outside the housing 30 do not run immediately in a planar manner with respect to one another, but have offsets and/or indentations.

In the embodiments illustrated in FIGS. 2c and 3b, the two connections 35, 36 have at least approximately the same thickness. In this case, said thickness is chosen in such a way that the electrical resistance of a conductor loop around the housing 30 is significantly less than the total resistance of the gate circuit. Typical values for the thickness of a flange are 0.3–0.5 mm.

The distance between the gate connection 35 and the auxiliary cathode connection 36 is relatively small. It is chosen in such a way that the inductance of a conductor loop around the housing 30 is significantly less than the total inductance of the gate circuit. Typical values are 1–2.5 mm, preferably at least approximately 1.8 mm. However, this distance does not depend only on the desired electrical properties, but also on the thickness of the connection board 1 of the associated gate unit GE, as is explained below.

Figure 2B:
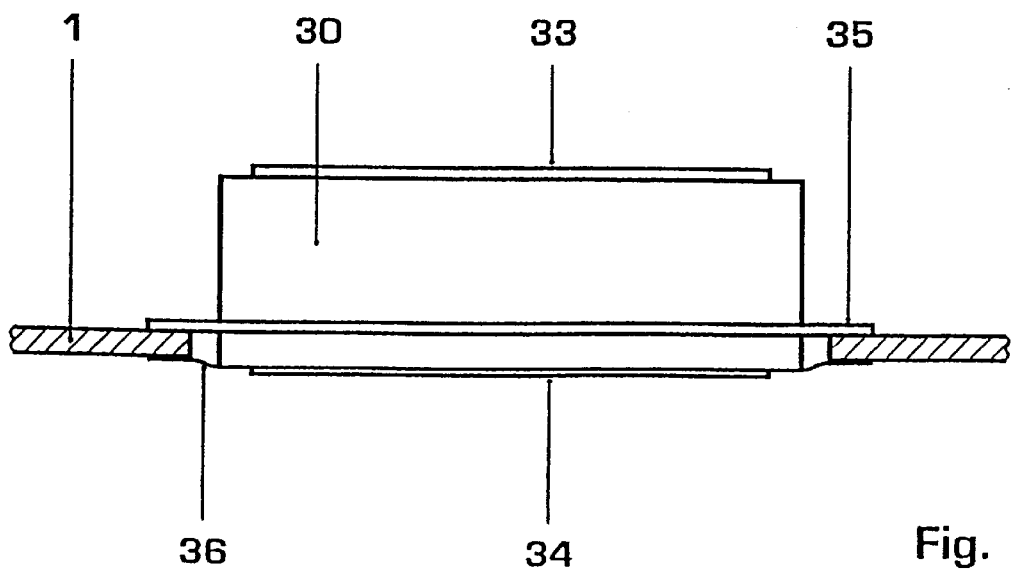
FIG. 2b shows the thyristor from FIG. 2a in side view, said thyristor being inserted in the connection board.

As can be seen from FIGS. 1 and 2b, for low-inductance driving, the thyristor 33 is connected in a specific manner to a drive circuit accommodated on the connection board 1. This is done by the thyristor 33 being inserted into a circular mounting opening 10 provided in the connection board 1. The internal diameter of the mounting opening 10 is distinctly less than the external diameter of gate connection 35 and auxiliary cathode connection 36. As a result, both connections 35, 36 overlap the connection board 1 at the edge of the mounting opening and can be connected over their entire circumference directly and with low inductance to the connection board 1 and/or the conductor tracks present on both sides of the connection board 1.

The distance between the gate connection 35 and the auxiliary cathode connection 36 is chosen such that—as shown in FIG. 2b—there is space between both for the thickness of the connection board 1. Since the auxiliary cathode connection 36 annularly surrounds the cathode 34, the cooling box bears directly against the cathode when the thyristor 3 is installed in the stack, thereby obviating the problems that arise when a cathode well is used in the prior art. On the other hand, the connection board 1 must, however, be brought in some way between the two connections 35 and 36, in order that the top side of the board can be brought directly into contact with the gate connection 35 and the underside of the board can be brought directly into contact with the auxiliary cathode connection 36.

Figure 4:
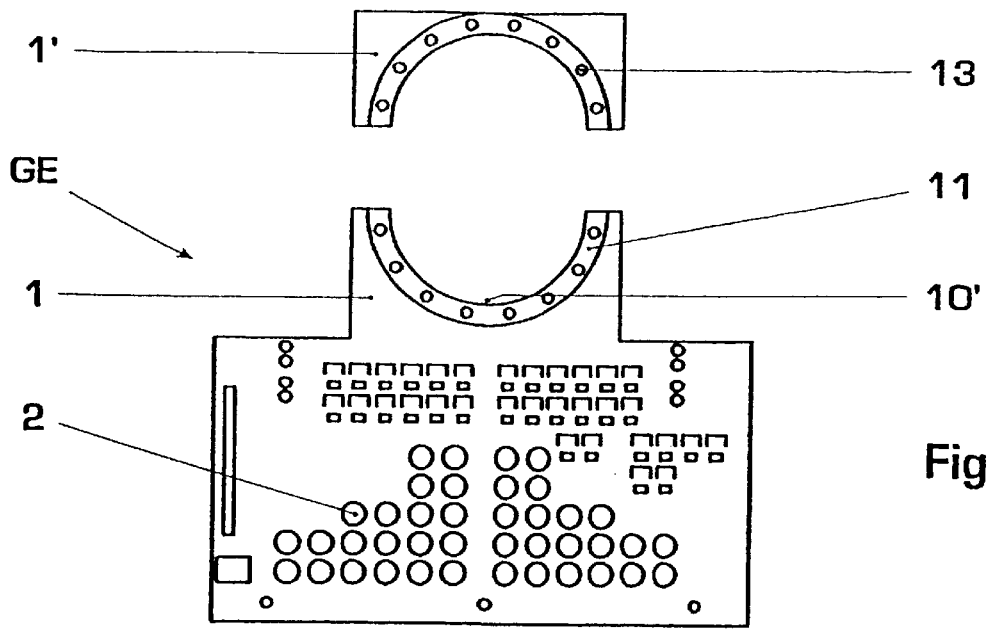
FIG. 4 shows a gate unit according to an exemplary embodiment of the invention.

FIG. 4 illustrates a first variant for fixing the semiconductor component to the connection board 1 of the gate unit GE. In order to accommodate the thyristor 3 according to the invention, the connection board 1 has an opening formed by a concave, preferably semicircular, incision 10' in the connection board 1. Present along this incision 10' on a first surface, there is a first semicircular metallized contact area 11 for making electrical contact with the gate electrode flange 35. A second semicircular metallized contact area 12 is fitted on an opposite second surface, and serves for making contact with the auxiliary cathode flange 36. At least in the region of these contact areas 11, 12, the connection board 1 including the contact areas 11, 12 has a thickness which corresponds at least approximately to the distance between the gate connection 35 and the auxiliary cathode connection 36. Fixing holes 13 penetrate through the two contact areas 11, 12, said holes being arranged at the same distance as the screw holes 35', 36' of the two connections 35, 36.

Figure 5:
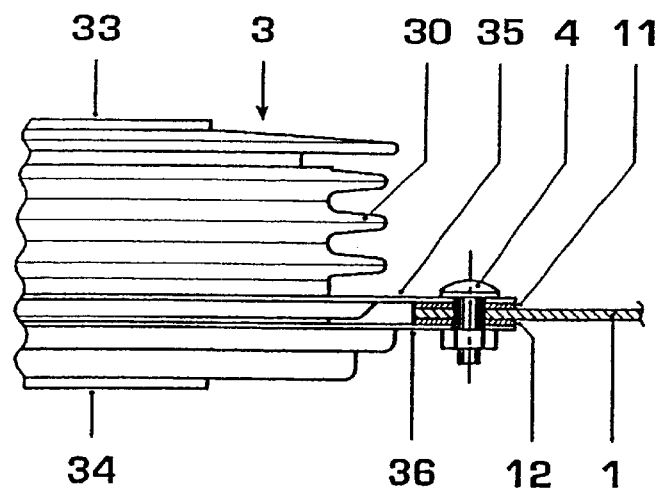
FIG. 5 shows an enlarged partial view of a mounted semiconductor component in accordance with the second embodiment.

During the mounting of the thyristor 3 into or onto the gate unit GE, the thyristor 3 is placed onto the connection board 1 by the incision 10 of the connection board 1 being pushed between the flange of the gate connection 35 and the flange of the auxiliary cathode connection 36. By means of electrically insulated fixing screws 4, which penetrate through the screw holes 35', 36' and the fixing holes 13, the emplaced semiconductor component 3 is subsequently fixed on the connection board 1, as is illustrated in FIG. 5.

A termination plate 1' is advantageously present, as illustrated in FIG. 4; it forms the mating piece for the connection board 1 described above and, after the emplacement of the thyristor 3, is joined to the incision end face of the connection board 1. In this case, the termination plate 1' is also pushed between the two flanges 35, 36 and fixed by means of fixing screws. Termination plate 1' and connection board 1 consequently form a round opening in which the semiconductor component 3 is held. Preferably, the termination plate 1' likewise has contact areas for making contact with the gate and auxiliary cathode connections 35, 36, in order to reduce the total inductance and to increase the turn-off capacity. The piece which is cut off during the fabrication of the incision 10 of the connection board 1 is preferably used as the termination plate 1'.

Figure 6:
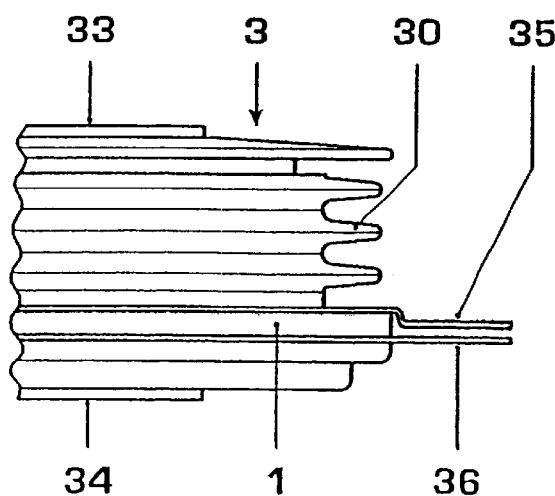
FIG. 6 shows an enlarged partial view of an exemplary fourth embodiment of a semiconductor component.

In principle, however, a termination plate 1' of this type is not necessary. If said termination plate 1' is dispensed with, it is advantageous for the flanges 35, 36 to be deep-drawn in their free region, as is illustrated in FIG. 6. This reduces the distance between the connections and hence the total inductance.

Figure 7A:
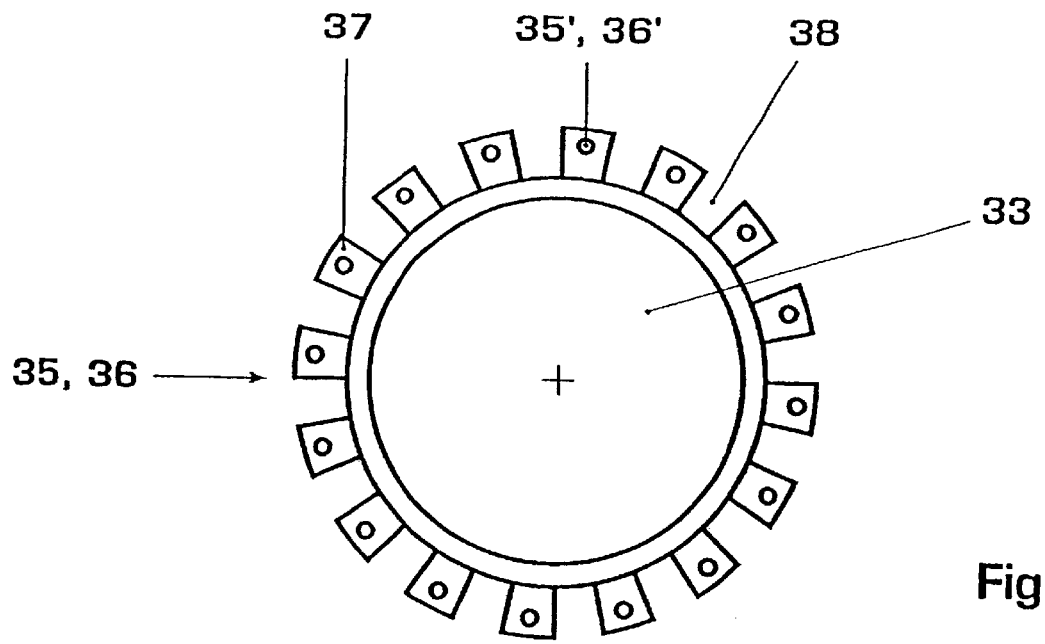
FIG. 7a shows the plan view from above of a fifth preferred exemplary embodiment of a thyristor according to the invention with mounting means in the form of segmented connections.
Figure 7B:
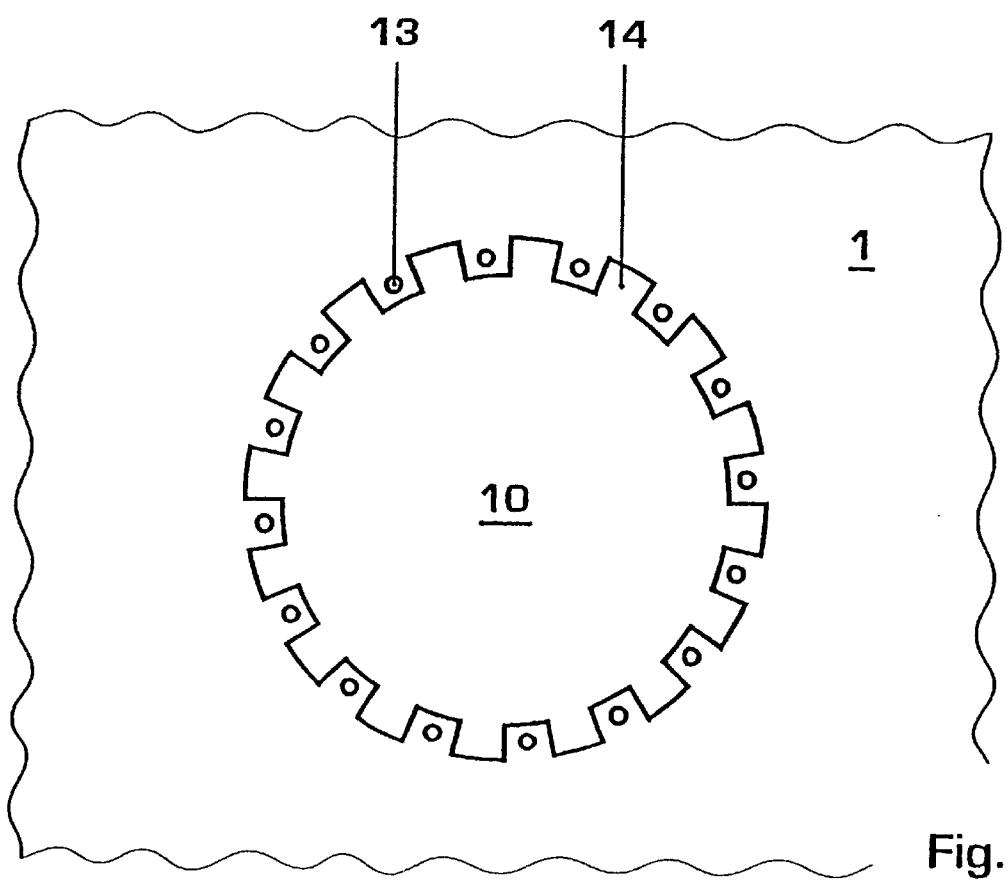
FIG. 7b shows the mounting means which match the thyristor according to FIG. 7a, in the form of segment-like cutouts on the connection board.
Figure 7C:
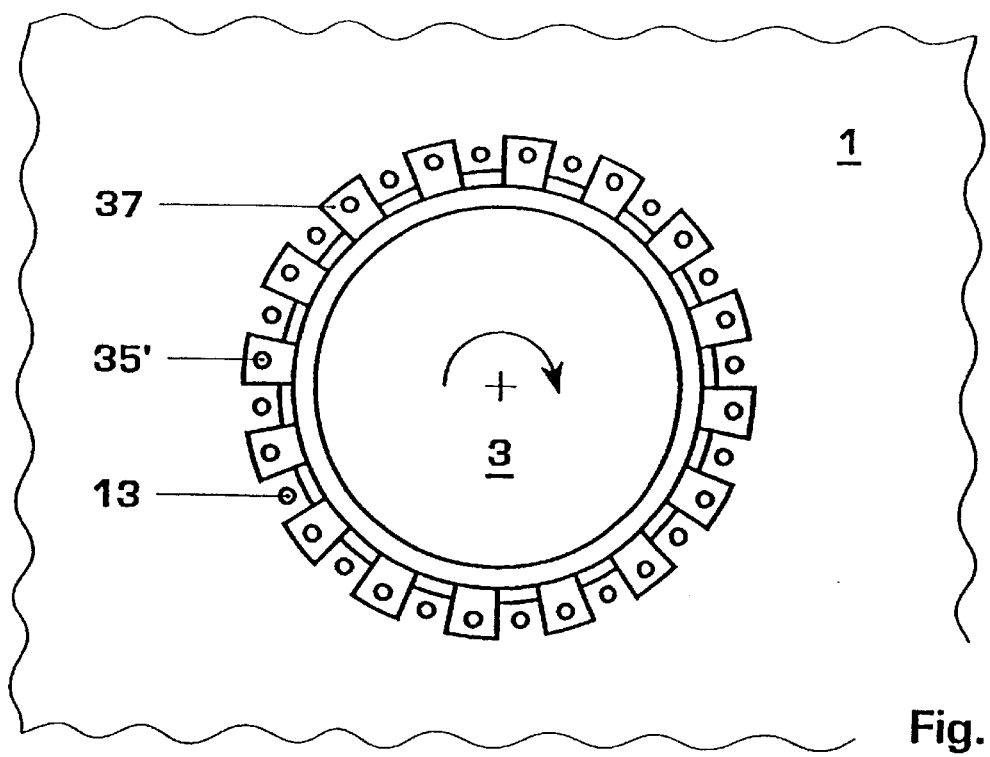
FIG. 7c shows the plan view from above of the thyristor according to FIG. 7a following insertion in the axial direction into the connection board.
Figure 7D:
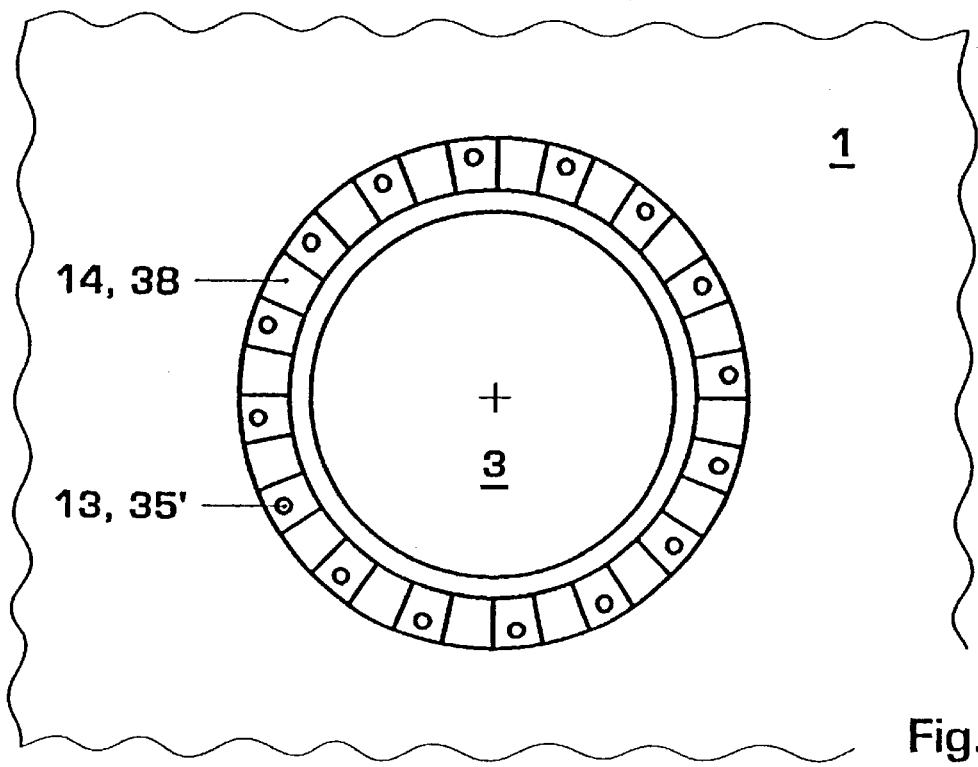
FIG. 7d shows the configuration according to FIG. 7c following rotation of the thyristor in the mounting opening.

In order not to disturb the low-inductance path through the multiple layers of the board around the thyristor 3, additional mounting means are proposed in preferred embodiments of the invention. A first preferred exemplary embodiment of these mounting means is shown in FIGS. 7a–d, where FIGS. 7a and 7b show the mounting means per se and FIGS. 7c and 7d show their use and effect. In the case of the first exemplary embodiment, according to FIG. 7a, the auxiliary cathode connection 36 and/or the gate connection 35 are/is subdivided into a plurality of segments 37, which are arranged such that they are distributed over the circumference and are separated from one another by first cutouts 38. Furthermore, according to FIG. 7b, the mounting opening 10 comprises second cutouts 14 in segment form, which are arranged such that they are distributed over the inner circumference and their number and dimensions correspond to those of the segments 37 of the connections 35, 36.

According to FIG. 7c, the thyristor 3 can then be placed into the mounting opening 10 with the housing axis 39 oriented perpendicular to the connection board 1, the segments 37 in each case being pushed through the corresponding cutouts 14 in the connection board 1. The thyristor 3 can then be brought to its final connection position by subsequent rotation about the housing axis 39 (arrow in FIG. 7c), the segments 37 being located below and/or above the regions between the cutouts 14 of the connection board 1. At least one screw hole 35', 36' and/or a fixing hole 13 is in each case provided in the individual segments 37 and in the regions lying between the cutouts 14 of the connection board 1, said screw holes serving to screw the gate connection 35 and/or the auxiliary cathode connection 36 to the connection board 1, which lie above one another in the connection position.

The connections 35 and 36 can be segmented in different ways: if only the auxiliary cathode connection 36 is segmented, the thyristor 3 must be inserted from above through the mounting opening 10. If only the gate connection 35 is segmented, the thyristor 3 must be inserted from below into the mounting opening 10. If, on the other hand, both connections 35 and 36 are segmented, the thyristor 3 can be pushed through optionally from above or from below. Preferably, the segments 37 and the first cutouts 38 have essentially the same dimensions. As a result of this, the connection area between connection board 1 and the segments 37 is maximized and the inductance is minimized. The number of segments 37 that is chosen may differ. It is 16 in the exemplary embodiment shown. In this case (FIGS. 7c, 7d) the thyristor 3 must be rotated through 360°/32 or 11.25° about the housing axis 39 in order to move from the insertion position (FIG. 7c) into the connection position (FIG. 7d). The distribution of the segments 37 over the circumference should be uniform for reasons of inductance, but may also be chosen to be nonuniform in special cases (for space reasons or the like).

Figure 8A:
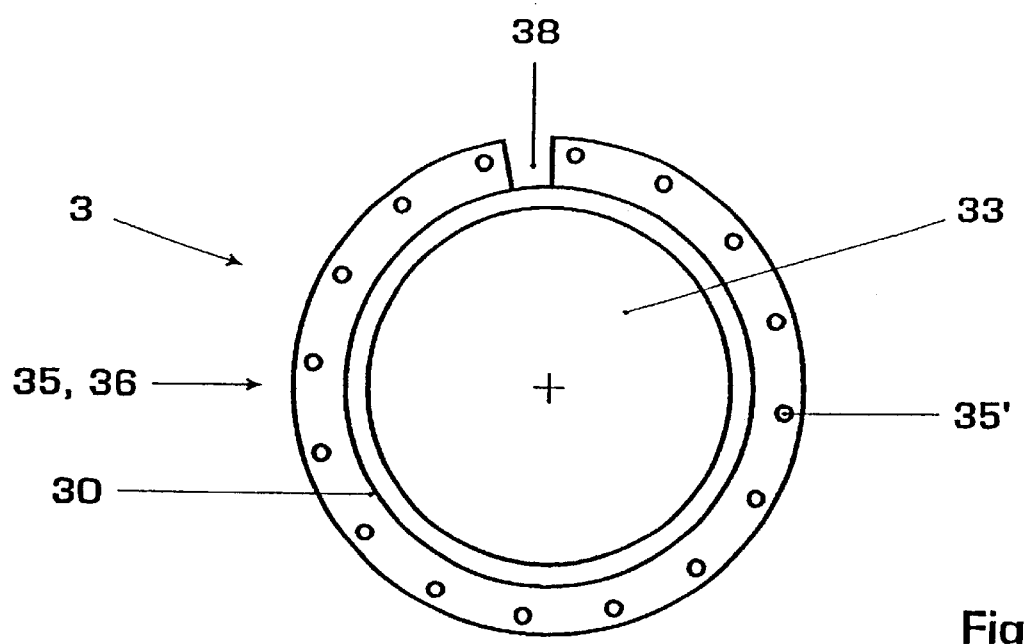
FIG. 8a shows the plan view from above of a sixth preferred exemplary embodiment of a thyristor according to the invention with mounting means in the form of a segment-like cutout in the connections.
Figure 8B:
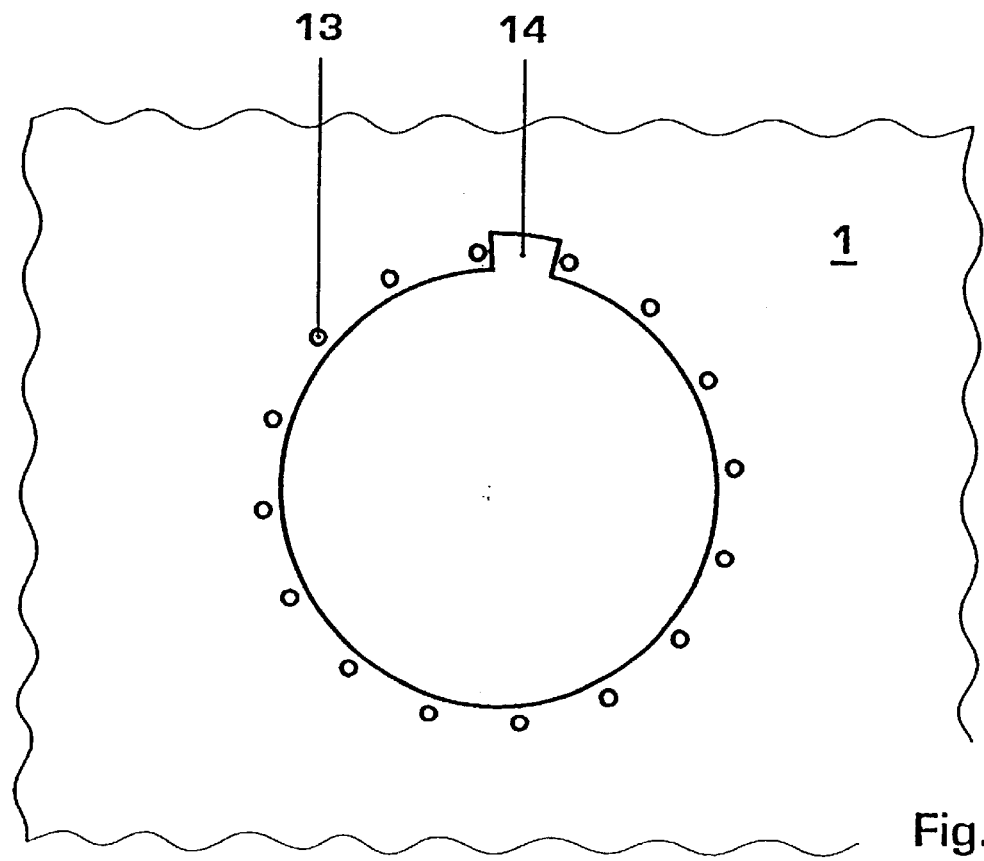
FIG. 8b shows the mounting means which match the thyristor according to FIG. 8a, in the form of a segment-like cutout on the connection board.
Figure 8C:
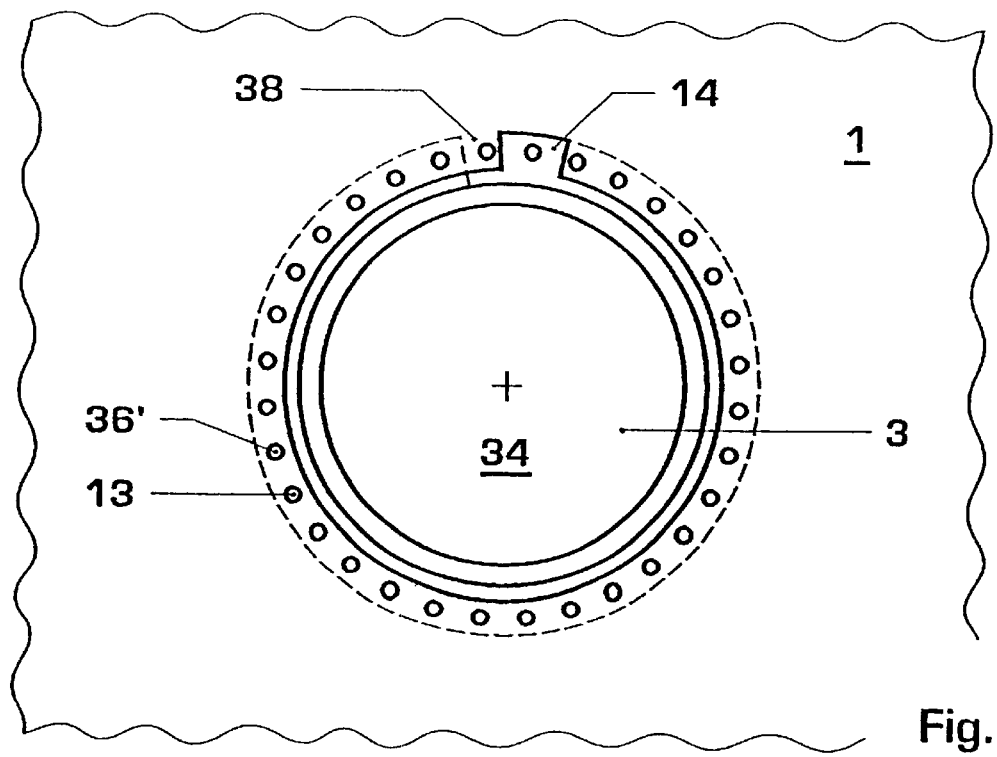
FIG. 8c shows the plan view from below of the thyristor according to FIG. 8a before the cathode connection ring is threaded into the cutout on the connection board.
Figure 8D:
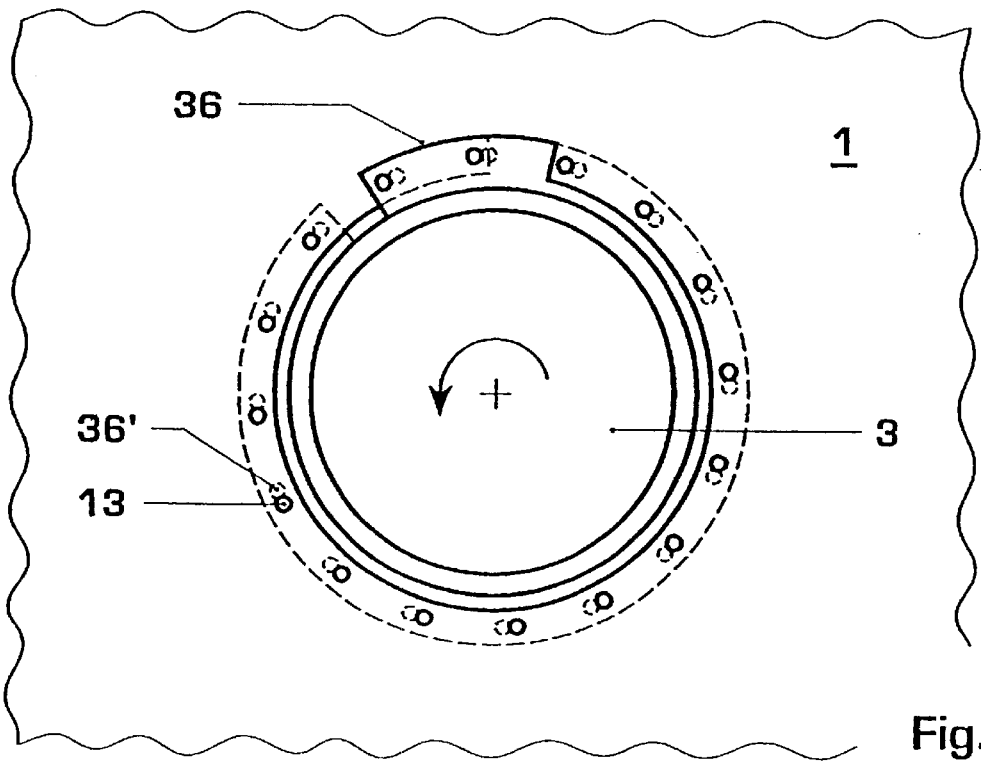
FIG. 8d shows the plan view from below of the thyristor according to FIG. 8a after the cathode connection ring has been threaded into the cutout on the connection board.

In the exemplary embodiment of FIGS. 7a–7d, with alternating cutouts 38 and segments 37 of equal size on the connections 35, 36, only half of the original ring area is available for the actual connection to the board 1. A significantly larger connection area can be achieved if the mounting means are designed in accordance with the second exemplary embodiment, which is shown in FIGS. 8a–8d. In this case, the auxiliary cathode connection 36 and/or the gate connection 35 are/is interrupted on its circumference by only one first cutout 38 in segment form (FIG. 8a). The mounting opening 10 likewise has only one second cutout 14 in segment form on its inner circumference (FIG. 8b). The thyristor 3 is now inserted into the mounting opening 10 in the manner shown in FIG. 8c (plan view from below; the thyristor 3 is now inserted from above into the mounting opening 10) in such a way that the beginning of the auxiliary cathode connection 36 at the edge of the cutout 38 is located in the cutout 14. The thyristor 3 is then tilted with the housing axis 39, with the result that the beginning of the auxiliary cathode connection 36 can be pushed through the cutout 14 to a point underneath the connection board 1. After this "threading in" or interconnection, the thyristor 3 can be screwed into the mounting opening 10 like a screw, with housing axis 39 inclined (FIG. 8d), in which case, with increasing rotation, an increasing length of the auxiliary cathode connection 36 reaches the underside of the board and it is situated completely underneath said board when the rotation has almost completed 360°.

In this case, too, a plurality of mutually matching screw holes 35', 13 are provided on the auxiliary cathode connection 36 and on the gate connection 35 as well as around the mounting opening 10, in a manner distributed on the circumference, said screw holes serving to screw the gate connection 35 and/or the auxiliary cathode connection 36 to the connection board 1. In this case, too, the cutout 38 may be present optionally on the auxiliary cathode connection 36, on the gate connection 35 or on both connections.

Figure 9A:
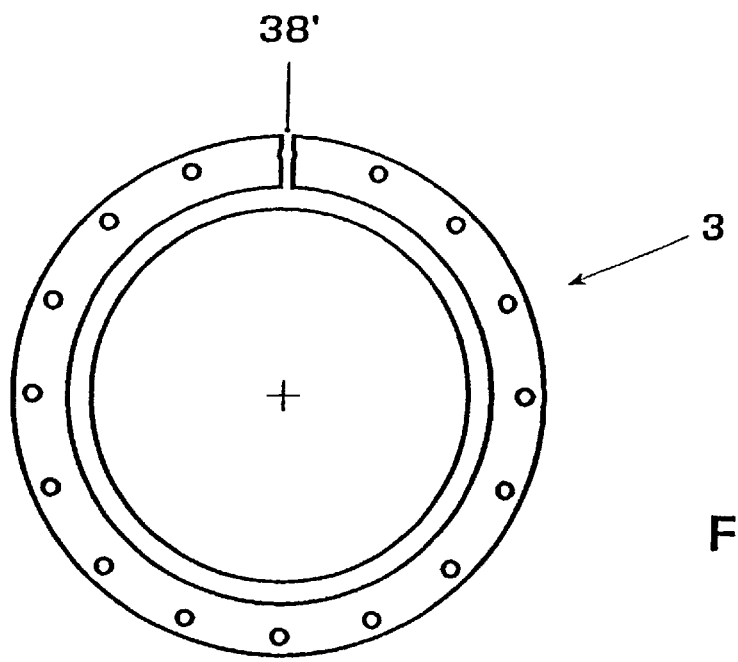
FIG. 9a shows the plan view from above of a seventh preferred exemplary embodiment of a thyristor according to the invention with mounting means in the form of a slot in the auxiliary cathode connection.
Figure 9B:
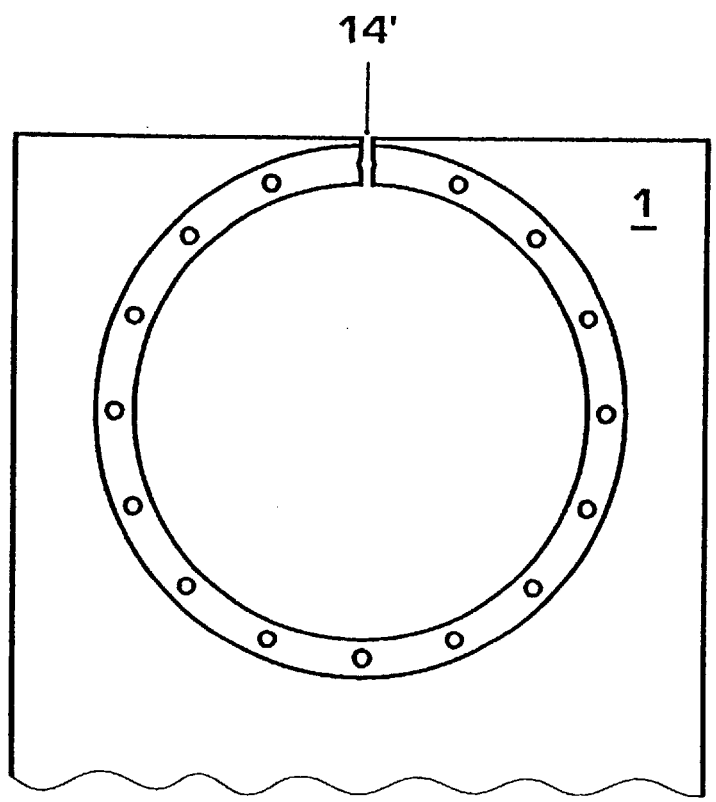
FIG. 9b shows the mounting means which match the thyristor according to FIG. 9a in the form of a slot on the connection board.

FIGS. 9a and 9b illustrate a further embodiment, allowing a large connection area. Instead of cutouts in segment form, narrow slots 38', 14' are now present. In the case of the thyristor 3, it suffices were a slot 38' to be present merely in one flange, in this case in the auxiliary cathode connection. The connection board 1 likewise has a slot 14', which extends as far as the board edge. The mounting takes place as in the case of the variant described with reference to FIGS. 8a–8d. In this embodiment, however, it is advantageous that the mounting opening 10 and also the connections 35, 36 form an almost intact circle, so that the gate current gradient is maximized.

In all three exemplary embodiments shown, the gate connection 35 of the thyristor 3 is located directly on the connection board 1 and the auxiliary cathode connection 36 is located directly underneath the board. In goes without saying, however, that the opposite positioning (auxiliary cathode connection 36 at the top, gate connection 35 at the bottom) is also possible and actually advantageous for specific mounting situations. Furthermore, instead of 16 screw holes 35', 13, it is also possible to choose any other number. However, 12 to 16 screws produce particularly good contact, as is required in the case of a high-current GCT (for example with 5–6 kA disconnection capacity in a housing 30 having a diameter of 1120 mm).

Overall, the invention affords a GCT driven with low inductance which is distinguished by a simple structure and simple mounting, is particularly suitable for high currents and powers, and enables undisrupted thermal coupling of the component in conjunction with an unchanged, low connection inductance.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

LIST OF DESIGNATIONS

HT Semiconductor device
GE Gate unit
1 Connection board
10 Mounting opening
10' Concave incision
11 First semicircular contact area
12 Second semicircular contact area
13 Fixing holes
14 Second cutout in segment form
14' Slot
1' Termination plate
2 Electrical devices
3 Gate controlled thyristor (GCT)
30 Housing
31 Semiconductor substrate
32 Molybdenum disk
33 Anode
34 Cathode
35 Gate connection
35' Screw hole
36 Auxiliary cathode connection
36' Screw hole
37 Segment
38 First cutout in segment form
38' Slot
39 Housing axis
4 Fixing screws

What is claimed is:
1. A semiconductor device comprising:
a semiconductor component; and
a connection board, the semiconductor component having:
an essentially cylindrical housing, which housing, for electrical connection of the semiconductor component, comprises an anode on one end, a cathode on another end and, in a plane between the anode and the cathode, an annular gate connection, which projects laterally from the housing and concentrically surrounds the housing, which semiconductor component, for low-inductance connection to a drive circuit accommodated on the connection board, is arranged in a mounting opening in the connection board, in such a way that the gate connection is located parallel to the connection board on one side of the connection board and projects beyond an edge of the mounting opening and is connected there to said one side of the connection board, and that the cathode is located on another side of the connection board and is connected to said another side of the connection board via a connection; and an auxiliary cathode connection of the semiconductor component to the connection board, the auxiliary cathode connection having a concentric annulus which projects laterally and parallel to the gate connection beyond the housing and projects beyond the edge of the mounting opening.

2. The semiconductor device as claimed in claim 1, wherein the mounting opening is formed by a concave, semicircular incision in the connection board.

3. The semiconductor device as claimed in claim 1, comprising:

means on at least one of the mounting opening, the auxiliary cathode connection and the gate connection for enabling the semiconductor component to be inserted into the mounting opening without any alteration to the semiconductor component or the connection board.

4. The semiconductor device as claimed in claim 3, wherein the means for enabling enable the semiconductor component to be inserted into the mounting opening with a housing axis oriented perpendicular to the connection board and to be brought into a connection position by rotation about the housing axis.

5. The semiconductor device as claimed in claim 4, wherein at least one of the auxiliary cathode connection and the gate connection is subdivided into a plurality of segments arranged such that they are distributed over a circumference and are separated from one another by first cutouts, and wherein the mounting opening comprises second cutouts in segment form, which are arranged such that they are distributed over an inner circumference with a number of second cutouts, and dimensions of which correspond to those of the segments.

6. The semiconductor device as claimed in claim 5, wherein the segments and the first cutouts have essentially equal dimensions.

7. The semiconductor device as claimed in claim 3, wherein the means for enabling enable the semiconductor component to be screwed into the mounting opening with the housing axis oriented in an inclined manner with respect to the connection board.

8. The semiconductor device as claimed in claim 7, wherein at least one of the auxiliary cathode connection and the gate connection has at least one first cutout in segment form on its circumference, and the mounting opening has at least one second cutout in segment form on its inner circumference.

9. The semiconductor device as claimed in claim 7, wherein at least one of the auxiliary cathode connection and the gate connection has a first cutout in slot form on its circumference, and the mounting opening has a second cutout in slot form, which extends as far as a board edge.

10. The semiconductor device as claimed in claim 1, wherein the semiconductor component is a thyristor.

11. A semiconductor component for arrangement in a mounting opening of a connection board having an accommodated drive circuit, said component comprising:

an essentially cylindrical housing, which housing, for electrical connection of the semiconductor component, comprises an anode on one end, a cathode on another end and, in a plane between the anode and the cathode, an annular gate connection, which projects laterally from the housing and concentrically surrounds the housing, which semiconductor component, when arranged in said mounting opening, is arranged, for low-inductance connection to a drive circuit accommodated on the connection board, in such a way that the gate connection is located parallel to the connection board on one side of the connection board and projects beyond an edge of the mounting opening and is connected there to said one side of the connection board, and that the cathode is located on another side of the connection board and is connected to said another side of the connection board via a connection; and an auxiliary cathode connection for connection of the semiconductor component to the connection board, the auxiliary cathode connection having a concentric annulus which projects laterally and parallel to the gate connection beyond the housing and projects beyond the edge of the mounting opening.

12. The semiconductor component as claimed in claim 1, wherein the auxiliary cathode flange and the gate electrode flange run at least approximately equidistantly with respect to one another.

13. The semiconductor component as claimed in claim 1, wherein the gate electrode flange and the auxiliary cathode flange have at least approximately equal external radii.

14. The semiconductor component as claimed in claim 1, wherein the component is a thyristor.

* * * * *